(12) United States Patent
Dent

(10) Patent No.: US 6,205,183 B1
(45) Date of Patent: Mar. 20, 2001

(54) METHODS OF SUPPRESSING REFERENCE OSCILLATOR HARMONIC INTERFERENCE AND RELATED RECEIVERS

(75) Inventor: Paul Wilkinson Dent, Pittsboro, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/087,281

(22) Filed: May 29, 1998

(51) Int. Cl.$^7$ ................ H04L 32/02; H04L 5/12
(52) U.S. Cl. .......... 375/261; 375/327; 375/344; 375/346; 455/312
(58) Field of Search .................. 375/322, 326, 375/327, 344, 346; 455/296, 312

(56) References Cited

U.S. PATENT DOCUMENTS

| | | | |
|---|---|---|---|
| 4,888,557 | 12/1989 | Puckette, IV et al. | 329/341 |
| 4,893,316 | 1/1990 | Janc et al. | 375/44 |
| 4,926,443 | 5/1990 | Reich | 275/102 |
| 5,048,059 | 9/1991 | Dent | 375/94 |
| 5,070,303 | 12/1991 | Dent | 328/145 |
| 5,084,669 | 1/1992 | Dent | 324/83 |
| 5,093,848 | 3/1992 | Raith | 375/97 |
| 5,136,616 | 8/1992 | Dent | 375/94 |
| 5,148,373 | 9/1992 | Dent | 364/484 |
| 5,159,705 | 10/1992 | Critchlow et al. | 455/76 |
| 5,241,702 | 8/1993 | Dent | 455/278.1 |
| 5,331,666 | 7/1994 | Dent | 375/94 |
| 5,335,250 | 8/1994 | Dent et al. | 375/10 |
| 5,568,518 | 10/1996 | Dent | 375/340 |
| 5,568,520 | 10/1996 | Lindquist et al. | 375/344 |
| 5,754,591 | * 5/1998 | Samueli et al. | 375/235 |

* cited by examiner

Primary Examiner—Chi Pham
Assistant Examiner—Phuong Phu
(74) Attorney, Agent, or Firm—Myers Bigel Sibley & Sajovec

(57) ABSTRACT

A receiver tunable to a plurality of frequency channels includes a reference frequency generator, a downconverter, an analog-to-digital converter, and a processor. The reference frequency generator generates a reference frequency signal, and the downconverter downconverts received signals to provide intermediate frequency signals. Moreover, the downconverter is synchronized to the reference frequency signal. The analog-to-digital converter generates a plurality of complex numbers representative of the received signals including interference components responsive to the intermediate frequency signals wherein the analog-to-digital converter is synchronized to the reference frequency signal. The processor estimates an origin point for the plurality of complex numbers and subtracts the origin point from each of the complex numbers thereby producing interference-compensated complex numbers representative of the received signals with reduced internally generated interference. Moreover, the processor processes the interference-compensated complex numbers to obtain desired signaling information. Related methods are also discussed.

50 Claims, 3 Drawing Sheets

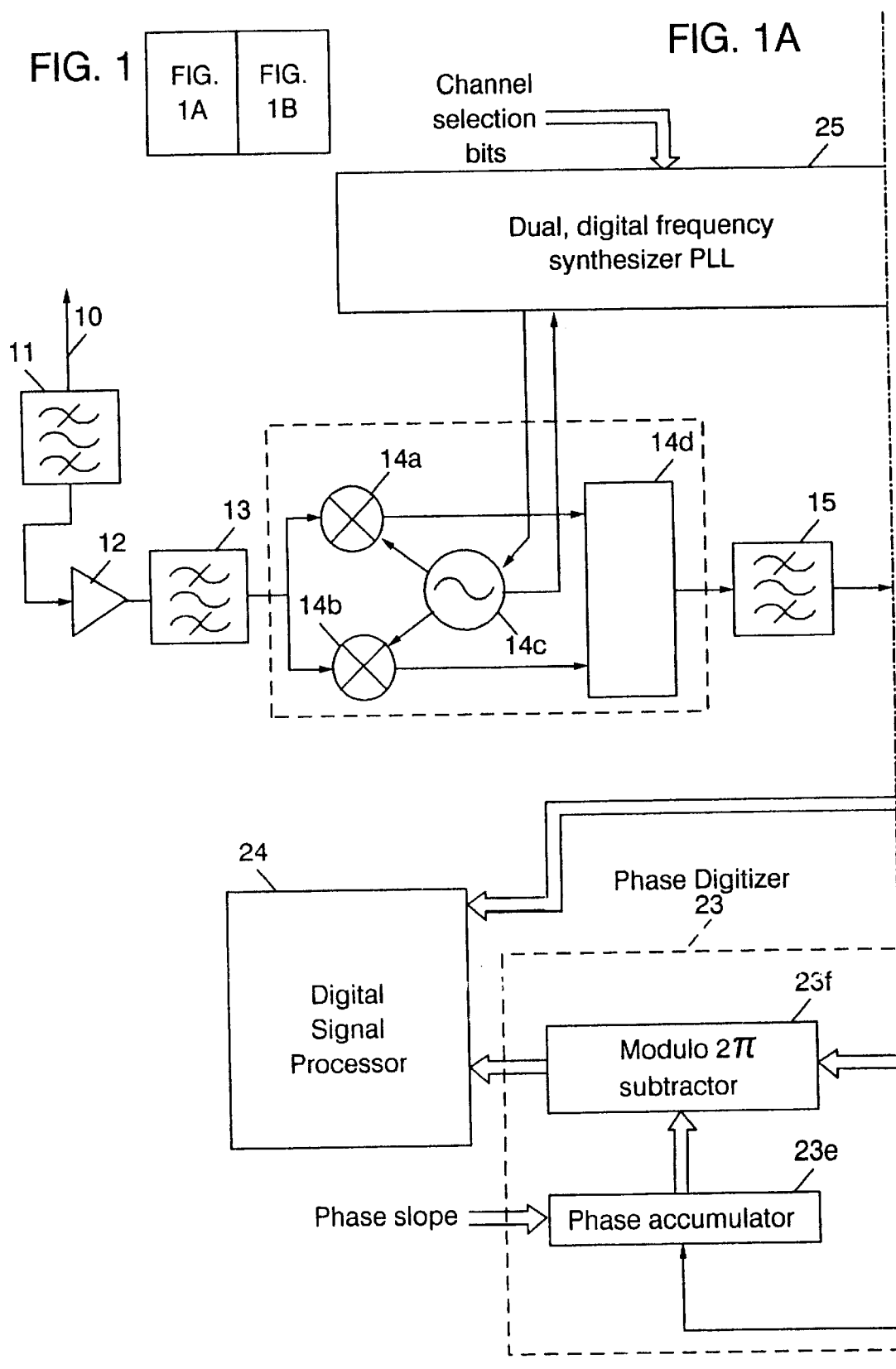

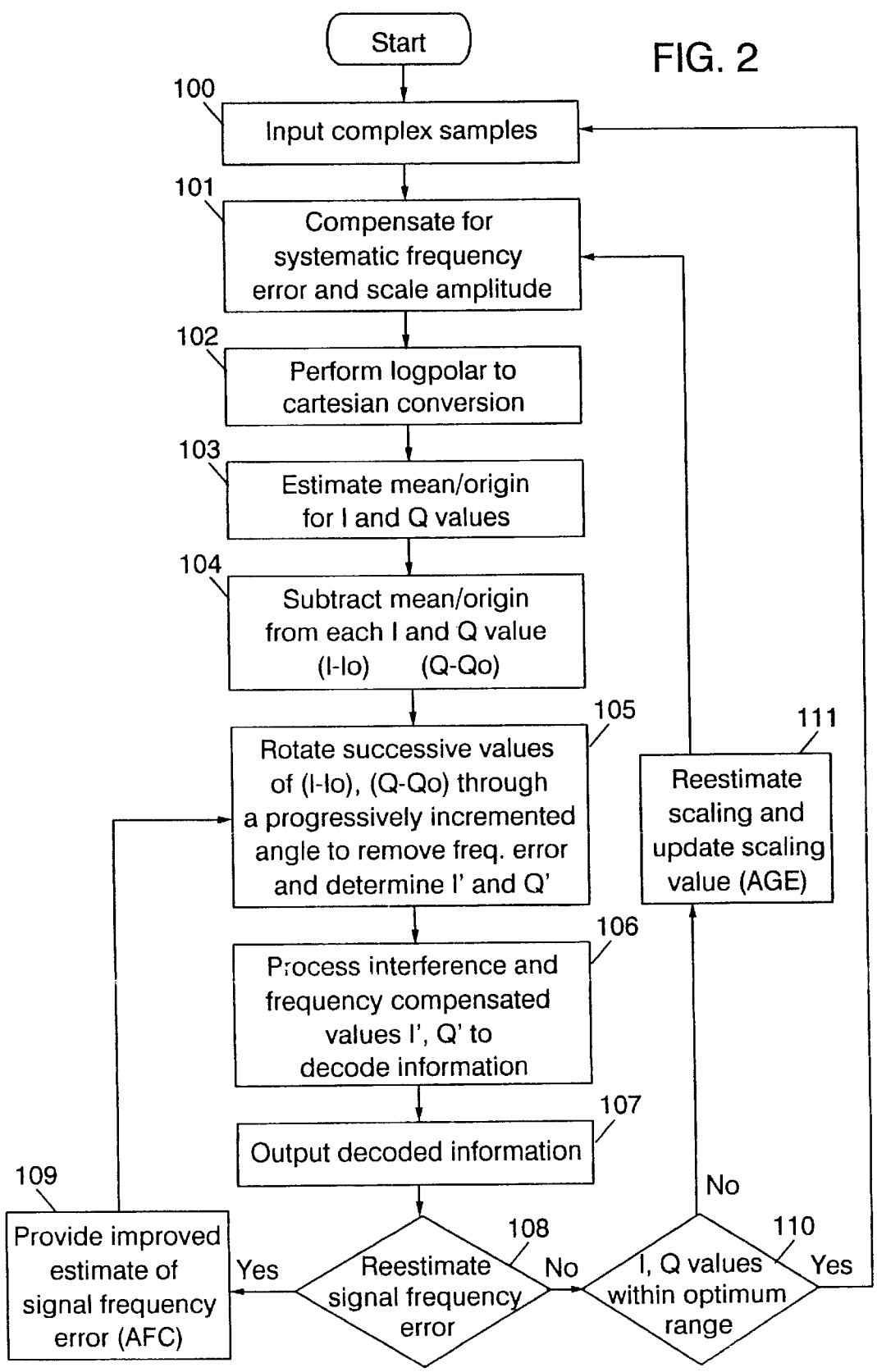

METHODS OF SUPPRESSING REFERENCE OSCILLATOR HARMONIC INTERFERENCE AND RELATED RECEIVERS

FIELD OF THE INVENTION

The present invention relates to the field of communications, and more particularly to receivers and methods for reducing reception sensitivity for crystal controlled receivers.

BACKGROUND OF THE INVENTION

In the field of radio receivers, there has been a concentrated effort to reduce the amount of tuned circuitry used in the receivers. By reducing the number of tuned circuits, large portions of the receiver can be integrated resulting in smaller receivers. These compact receivers can then be used in many areas such as cellular telephones. A major advance in the design of such receivers is a technique known as the "zero-IF" technique.

Slope, drift, and offset compensation in zero-IF receivers is discussed, for example, in U.S. Pat. No. 5,568,520 entitled "Slope Drift and Offset Compensation In Zero-IF Receivers". In addition, U.S. Pat. No. 5,241,702 entitled "Slope Drift And Offset Compensation In Zero-IF Receivers" discusses reducing DC offset in homodyne (zero-IF) receivers by differentiating the I,Q signals before digitization using an analog differentiating circuit, and then re-integrating the signal samples numerically after digitization to restore the signal's undifferentiated waveform. Each of these patents is hereby incorporated herein in its entirety by reference. Furthermore, the inventor of the present invention is an inventor in each of these patents.

In homodyne receivers, received signals are converted directly down to zero frequency I and Q signals, also called the quadrature baseband, by mixing the received signal against a local oscillator placed in the center of the desired receive channel. Since the local oscillator is directly on top of the received signal, it may be a significant source of interference to reception. Because the interfering signal may be the same as the downconversion oscillator, however, it is coherent interference and appears as DC offset on the I,Q outputs. This DC offset can be much larger than the weakest signal that the receiver is desired to receive and can drive the I,Q Analog-to-Digital convertors to full scale or beyond, causing signal degradation.

The patents discussed above thus provide ways to reduce DC offset of the I,Q signals to reduce interference from a local oscillator within a homodyne receiver. In known homodyne receivers, the local oscillator frequency may be the dominant crystal-related interfering signal because the local oscillator is tuned to the channel frequency by means of a digital frequency synthesizer using the crystal as a reference.

These patents, however, may not resolve problems relating to superhetrodyne receivers wherein received signals are mixed with a local oscillator that is not tuned to the channel frequency but that is tuned to the channel frequency plus or minus a constant offset equal to the desired first intermediate frequency. In such a system, the local oscillator may not be a significant source of interference to a desired signal and the problem of DC offset in I and Q signals may not be evident or obvious.

Interference to a desired signal by other crystal related frequencies such as crystal harmonics, however, may also contribute to the DC offset in the I and Q signals. Accordingly, there continues to exist a need in the art for improved receivers and methods of reducing interference.

SUMMARY OF THE INVENTION

It is therefore an object of the present invention to provide improved receivers and methods.

It is another object of the present invention to provide receivers with reduced interference and related methods.

These and other objects are provided according to the present invention by a receiver including a reference frequency generator, a downconverter, an analog-to-digital converter such as a phase digitizer, and a processor wherein the downconverter and analog-to-digital converter are both synchronized to a common reference frequency signal generated by the reference frequency generator. More particularly, the downconverter downconverts received signals to provide intermediate frequency signals, and the analog-to-digital converter generates a plurality of complex numbers representative of the received signals including interference components responsive to the intermediate frequency signals. In addition, the processor processes the complex numbers to obtain desired signaling information.

Systematic frequency errors introduced by the analog-to-digital conversion process can thereby be reduced by processing the digitized signal samples. Furthermore, when the receiver is tuned to a frequency channel that is a harmonic of the crystal of the reference frequency generator, the crystal related interference can be reduced using, for example, a digital high-pass filter or averaging to discriminate constant error components.

More particularly, a receiver according to an embodiment of the present invention is tunable to a plurality of frequency channels. The receiver includes a reference frequency generator, a downconverter, an analog-to-digital converter, and a processor. The reference frequency generator generates a reference frequency signal, and the downconverter downconverts received signals to provide intermediate frequency signals wherein the down converter is synchronized to the reference frequency signal. The analog-to-digital converter generates a plurality of complex numbers representative of the received signals including interference components related to the reference frequency signal wherein the analog-to-digital converter is synchronized to the reference frequency signal. The processor estimates an origin point for the plurality of complex numbers and subtracts the origin point from each of the complex numbers thereby producing interference-compensated complex numbers representative of the received signals with reduced internally generated interference. The processor also processes the interference-compensated complex numbers to obtain desired signaling information.

In particular, the downconverter can include a local oscillator synchronized to the reference frequency signal, first and second mixers driven by the oscillator, and a combining network so that the received signals are provided to the first and second mixers, the outputs of which are combined in the combining network to provide the intermediate frequency signals. The reference frequency generator can include a reference frequency oscillator. Moreover, the received signals can be received at an antenna, and a filter can be serially coupled with the downconverter between the antenna and the analog-to-digital converter. In addition, an amplifier can be serially coupled with the downconverter between the antenna and the analog-to-digital converter, and the estimated origin point can include an 'x' coordinate Io and a 'y' coordinate Qo.

The receiver can also include a digital frequency synthesizer coupled with the reference frequency generator so that the receiver is tuned to channel frequencies that are related to the reference frequency by a ratio of two integers. Moreover, the analog-to-digital converter can employ quadrature downconversion to analog I and Q signals followed by analog-to-digital conversion of each of said I and Q signals. Alternately, the analog-to-digital converter can convert the intermediate frequency signals to pairs of values representative of instantaneous signal phase and instantaneous signal amplitude, or the analog-to-digital converter can perform quadrature sampling of the intermediate frequency signal.

The plurality of complex numbers can include compensation for systematic frequency error in the receiver, and the estimated origin point can be estimated from a mean of real components of the plurality of complex numbers and from a mean of imaginary components of the plurality of complex numbers. In addition, the origin point can be estimated by estimating a center of one of a circle and an arc on which the plurality of complex numbers are expected to lie, or by using a known signal pattern included in the received signals. The estimated origin point can also be re-estimated using the desired signaling information.

A receiver according to the present invention can thus reduce DC thereby reducing interference to certain frequency channels that encompass crystal harmonics or other crystal-related frequencies.

BRIEF DESCRIPTION OF THE DRAWINGS

FIG. 2 is a flowchart illustrating operations of the processor of FIG. 1.

DETAILED DESCRIPTION

Figure 1B:
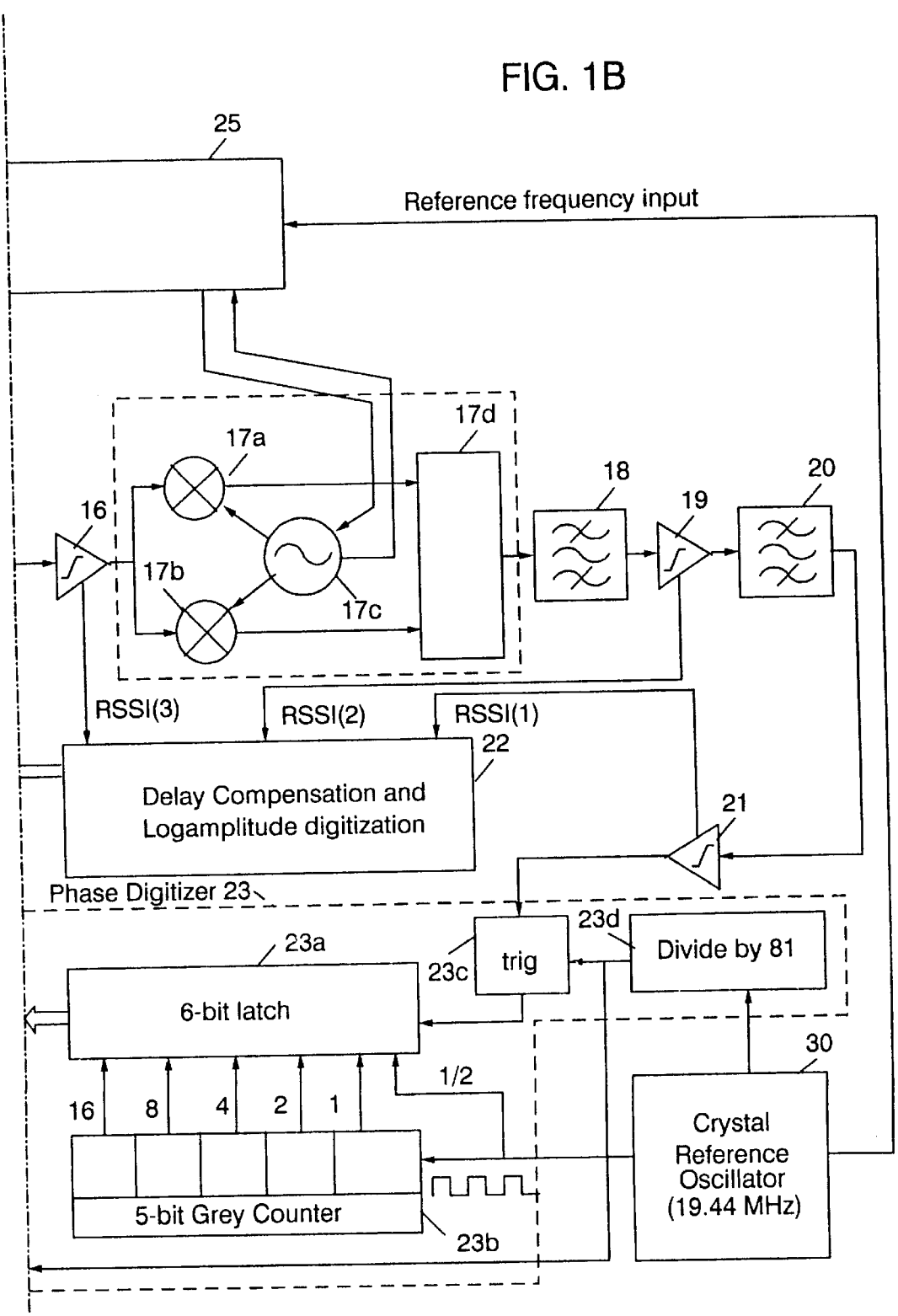
FIG. 1 is a block diagram illustrating a receiver according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

A radio receiver according to the present invention downconverts received signals to an Intermediate Frequency (IF) by mixing the received signals with a signal from a first local oscillator. The local oscillator is phase locked to a reference crystal oscillator using a digital frequency synthesizer phase lock loop. A single downconversion step and single local oscillator may be provided (single superheterodyne), or alternately, a two-step downconversion may be provided using first and second local oscillators (double superheterodyne). In this case, both first and second local oscillators are phase locked to the same crystal reference oscillator. Additional downconversion steps may be used, as long as each local oscillator is phase locked to the same crystal reference oscillator.

The final Intermediate Frequency obtained after all downconversion steps is then digitized using an analog-to-digital convertor which preserves both amplitude and phase information. For example, a quadrature downconvertor can be used to obtain I and Q signals which are then separately converted from Analog-to-Digital to obtain a stream of complex numbers each having a real and an imaginary part (I and Q streams). Alternately, quadrature sampling can be used wherein the final Intermediate Frequency signal is sampled and digitized in sample pairs taken an odd number of quarter cycles of the nominal Intermediate Frequency apart to obtain samples alternately related to I and Q. Furthermore, logpolar conversion can be used to obtain numerical value pairs related to the Intermediate Frequency signal phase and amplitude. The latter may be converted by digital signal processing circuitry to I and Q samples by performing, for example, a logpolar to Cartesian conversion using look-up tables.

The Analog-to-Digital conversion step can use sampling rates that are also locked to the crystal reference frequency, for example, by dividing the crystal frequency by an integer division ratio to obtain the sampling rate for Analog-to-Digital conversion. The phase digitization in a logpolar conversion process also uses, as a reference for defining phase, a signal derived from the crystal reference oscillator.

Systematic frequency errors introduced by the Analog-to-Digital conversion step can thus be reduced. For example, systematic frequency errors can result from the use of a phase reference signal that has a constant frequency difference or constant phase slope relative to the nominal final intermediate frequency. Systematic frequency errors can also result from the use of a quadrature downconvertor to obtain I and Q signals by mixing the final Intermediate Frequency signal with cosine and sine signals at a frequency having a constant frequency offset from the nominal final Intermediate Frequency, and these errors can now be removed numerically by processing the digitized signal samples.

For example, in a logpolar solution, systematic frequency error may be conveniently removed before logpolar to Cartesian conversion by subtracting a phase accumulator value from the phase samples, wherein the phase accumulator value is incremented at the phase sampling rate by an increment corresponding to the frequency error expressed as a phase increment per sampling period. Systematic frequency error reduction from samples already in Cartesian or I,Q form can be reduced by complex multiplication of each (I,Q) value by a complex number (cos(theta)-j.sin(theta)) where theta equals the above-mentioned phase accumulator value. Alternately, a Cartesian to polar transformation can be performed so that frequency error is removed from the phase angle value using a phase accumulator as already described, followed by a polar back to Cartesian conversion.

In each case, the final result is a stream of Cartesian I and Q samples that exhibits constant values from sample to sample if the receiver is caused to receive a nominally correct, unmodulated signal centered in the channel to which the receiver is tuned. A nominally correct signal is defined as one which bears an expected relationship to the reference frequency crystal, regarded as a standard of frequency accuracy, the relationship being, for example, the ratio of two integers.

When a receiver according to the prior art is tuned to a frequency channel that is a harmonic of the crystal, such that one of the aforementioned integers is unity, the prior art receiver can be desensitized by interference from the crystal oscillator, which can produce harmonics of significant strength, one of which lies in the receiver channel. In a receiver according to the present invention, such interferences from a crystal-related signal will produce constant additions Io and Qo to the final streams of I and Q samples respectively. The constant, additive error due to such interference, however, can be removed using, for example, a digital high-pass filter to block the DC component of the I and Q sample streams. Alternatively, the additive errors Io and Qo can be determined by averaging the I and Q sample streams over a sufficiently long time to discriminate the constant error components from the varying modulation components. The Io and Qo values thus determined can then be subtracted from each I,Q sample to reduce interference from crystal-related spurious signals.

FIG. 1 is a block diagram illustrating a receiver according to the present invention. This block diagram illustrates an exemplary embodiment of the present invention including a variety of components that can be provided in a receiver according to the present invention. Not all of these components, however, are necessary to provide a receiver according to the present invention. For example, the receiver of FIG. 1 is a double superheterodyne receiver, but the invention may also be implemented with a single superheterodyne receiver.

In FIG. 1, radio signals are received at antenna 10 and filtered by receive band bandpass filter 11 (such as a duplexing or receive filter) to reduce out-of-band signals such as own transmitter signals generated by a transmitter of the terminal. The filtered signal is amplified by low-noise amplifier 12 and further filtered by bandpass filter 13 to further suppress out-of-band signals such as transmitter signals and mixer spurious response frequencies such as the (2,2) or half-IF spurious response. The signal is then downconverted using a first image rejection downconvertor 14 including mixers 14a and 14b driven by cosine and sine local oscillator signals from quadrature oscillator 14c, and an Intermediate Frequency (IF) Hilbert network. The outputs of the mixers are combined by the IF Hilbert network 14d. The image rejection mixer 14 further suppresses reception of an unwanted mixer spurious frequency known as the image frequency.

Quadrature first local oscillator 14c is tuned to a channel frequency using dual digital frequency synthesizer 25 phase locked loop (PLL). The channel frequency can be, for example, a multiple of 30 KHz which is equal to the 19.44 MHz reference frequency divided by (8×81). Synthesizer 25 can thus be programmed by channel selection bits to control oscillator 14c to an integer times the reference frequency divided by (8×81). The frequency of the first local oscillator 14c can actually be controlled to the desired channel frequency plus an offset equal to the desired first intermediate frequency, which is for example 71.64 MHz. Choices of these frequencies are discussed in U.S. patent application Ser. No. 08/974,227 to Gore et al. and entitled "Simplified reference frequency distribution in a mobile phone which was filed Nov. 19, 1997. This Application is hereby incorporated herein in its entirety by reference.

First IF filter 15 is a bandpass filter centered on the first Intermediate Frequency, for example 71.64 MHz, to suppress signals on unwanted frequency channels. It is common to provide two or three stages of channel filtering interspersed with stages of amplification to achieve the degree of other channel suppression desired. It may be difficult, however, to achieve sufficient filtering and amplification at a single frequency because of leakage or other unwanted spurious coupling between printed circuit board tracks. Therefore, in a double superheterodyne receiver, the already filtered first IF signal, after partial amplification in first IF amplifier 16, can be further downconverted in second downconvertor 17 which is also preferably of the image rejection type. The second downconvertor includes a second local oscillator 17c which is also digitally phase locked to a reference frequency signal, for example 19.44 MHz, from reference crystal oscillator 30. A suitable dual-frequency synthesizer phase lock loop circuit for synthesizer 25 is available as Philips part no. UM1002.

The second downconvertor converts the first Intermediate Frequency signal to a second Intermediate Frequency signal which is desired to be close to the reference frequency divided by a power of 2 thereby simplifying the design of phase digitizer 23. For example, 19.44 MHz divided by $2^5$ is equal to 607.5 KHz, so that a second Intermediate Frequency of 600 KHz, which is still a multiple of the 30 KHz channel spacing, is chosen. The second local oscillator frequency is then either the first Intermediate Frequency plus 600 KHz (for example 71.64+0.6=72.24 MHz), or the first Intermediate Frequency minus 600 KHz (for example 71.64−0.6=71.04 MHz). These frequencies are respectively 301×(19.44 MHz/81) and 296×(19.44 MHz/81), allowing synthesizer 23 to synthesize these frequencies as an integer multiple of 240 KHz which is derivable from the crystal reference frequency by division by the integer 81.

The 600 KHz second Intermediate Frequency signal from second downconvertor 17 is further filtered and amplified in 2nd Intermediate Frequency filters 18 and 20 interspersed with second Intermediate Frequency amplifiers 19 and 21. Amplifiers 16, 19, and 21 can, for example, provide a logarithmic amplifier, each stage of which has an associated detector for measuring signal amplitude wherein each stage progressively saturates as the signal amplitude increases. The outputs from detectors within the same amplifier block may be summed to produce partial Radio Signal Strength Indicators RSSI(1), RSSI(2) and RSSI(3). The three partial RSSI signals may be compensated for relative delay in the signal passing through filters 18 and 20 before combining to produce a delay-compensated composite RSSI signal that is digitized in delay compensator and digitizer 22 to produce a stream of logpolar values at the selected digital sampling rate. A suitable technique for delay compensation is described, for example, in U.S. Pat. No. 5,070,303 entitled "Logarithmic Amplifier/Detector Delay Compensation" to the inventor of the present invention. This patent is hereby incorporated herein in its entirety by reference.

The final second Intermediate Frequency output from amplifier 21 is hardlimited to obtain a square wave that retains signal phase information in its zero crossing times. The time of second Intermediate Frequency zero crossings can be determined to an accuracy of half a reference clock cycle by phase digitizer circuit 23. The phase digitizer circuit 23 divides the reference frequency of 19.44 MHz by 81, for example, in divider 23d to obtain a desired sampling rate of 240 KHz. The phase digitizer 23 also divides the reference frequency of 19.44 MHz by 32 in five-bit counter 23b, which counts in Grey code wherein only one binary digit changes at a time. The counter state thus repeats at a rate of 607.5 KHz which is close to the 2nd IF of 600 KHz with a systematic 7.5 KHz error.

A trigger circuit 23c is armed when it is desired to digitize a phase value, and the next Intermediate Frequency zero crossing after the trigger is armed causes the state of 5-bit counter 23b together with the up/down state of the reference clock waveform to be latched into 6-bit latch 23a. The value in the latch is between 0 and 63 and quantizes the instantaneous signal phase to a multiple of 360/64=5.625 degrees.

If the second Intermediate Frequency signal happens to have a frequency of 607.5 KHz, which is the same as the repetition rate of counter 23b, then counter 23b would reach the same state every time an Intermediate Frequency zero crossing was sampled, and the phase value latched into latch 23a would be constant. The nominal second Intermediate Frequency is 600 KHz, however, which is 7.5 KHz lower than the value 607.5 KHz that would result in a constant latched value. Consequently second Intermediate Frequency zero crossings occur progressively later for each 240 KHz sampling period by 7.5/240 cycles, or 11.25 degrees, which is two phase steps. Thus the latch 23a latches phase values which are progressively greater by 2 least significant steps on each successive sample. This progressive phase slope is removed by incrementing phase accumulator 23e by two Least Significant Bits at each sample clock to generate the same phase slope, and then subtracting the accumulator value from the value of latch 23a in modulo-2Pi subtractor 23f to obtain phase values that compensate for the systematic 7.5 KHz frequency error in the system. The compensated phase values will be constant when the receiver receives a nominally on-channel signal that downconverts to the 600 KHz second Intermediate Frequency.

Phase digitizer circuits that can be used to directly digitize the instantaneous phase of a signal are discussed in U.S. Pat. No. 5,084,669 entitled "Direct Phase Digitization" and U.S. Pat. No. 5,148,373 entitled "Method And An Arrangement For Accurate Digital Determination Of The Time Or Phase Position Of A Signal Pulse Train" both to the inventor of the present invention. Both of these patents are hereby incorporated herein in their entirety by reference. The use of a phase digitizer such as circuit 23 and an RSSI digitizer 22 to digitize a radio signal while preserving its complex vector information in logpolar form is discussed in U.S. Pat. No. 5,048,059 entitled "Log-Polar Signal Processing" to the inventor of the present invention. This patent is also incorporated herein in its entirety by reference. Alternatively, a downconverted radio-frequency signal may be converted to a representative stream of Cartesian complex numbers using for example quadrature sampling, as discussed, for example, in U.S. Pat. No. 4,888,557 entitled "Digital Subharmonic Sampling Down-Converter" to Puckette, IV et al., which is hereby incorporated herein in its entirety by reference.

Logpolar values are convenient for applying amplitude scaling (digital AGC) and for applying frequency correction for frequency accuracy differences between the received signal and the reference frequency crystal oscillator 30 (AFC), as discussed in U.S. Pat. No. 5,568,518 entitled "Fast Automatic Gain Control" to the inventor of the present invention. This patent is hereby incorporated herein in its entirety by reference. For other functions, such as demodulating a digitally modulated signal, Cartesian representation may be more convenient, as discussed in U.S. Pat. No. 5,331,666 entitled "Adaptive Maximum Likelihood Demodulator" to the inventor of the present invention. This patent is hereby incorporated herein in its entirety by reference.

In the disclosures of U.S. Pat. Nos. 5,568,518 and 5,332, 666 discussed above, correction of received frequency errors was discussed in the logpolar domain prior to Cartesian conversion for demodulation. However, according to the present invention, signals (if in logpolar form) are converted to Cartesian form after compensation only for systematic frequency error and not for random received signal frequency error caused by relative transmitter/receiver inaccuracies or Doppler shifts. After conversion to Cartesian form, if not already digitized in Cartesian form, spurious signals related to the internal crystal reference frequency, such as harmonics of oscillator 30, may manifest themselves as constant offsets to the real and imaginary parts, customarily denoted by I and Q, of the Cartesian representation. These constant offsets may depend on the channel frequency to which the receiver is tuned among other factors, such as the way a handheld receiver is held in the hand or the proximity of objects to the antenna. These factors, however, change only slowly relative to the information modulation of a wanted signal, so that wanted information modulation can be discriminated from unwanted internal spurious signals by its rate of change.

Digital signal processor 24 thus converts logpolar signals to Cartesian form, if the signals are not already digitized in Cartesian form, and then estimates the constant or relatively slowly varying components of I and Q, for example, by averaging the I and Q signals over a sufficiently long period so that the more rapidly varying information modulation cancels. Different types of known averagers, such as moving block averagers or exponential forgetting averagers, may be used. Alternatively, when a wanted signal is known to consist of a constant amplitude signal modulated only in phase, the signal vector should describe a circle or an arc of constant radius. The center of the circle, however, may be displaced from the origin 0,0 by the I,Q constant offsets caused by internal interference. U.S. Pat. No. 5,241,702 entitled "D.C. Offset Compensation In A Radio Receiver" to the inventor of the present invention, discusses how a circle or an arc of a circle may be best-fitted to a number of successive signal vectors so as to determine both the radius R and the center coordinates Io,Qo. This patent is hereby incorporated herein in its entirety by reference.

The determined center coordinates in this application are the I and Q offsets caused by internal interference from, for example, crystal harmonics, and may be subtracted from every I,Q value to produce I,Q values from which interference has been reduced. This interference reduction preferably takes place before applying any further frequency correction for received signal frequency error. This further frequency correction, if required, may now be applied by rotating the interference compensated I,Q values through a progressively incrementing or decrementing phase angle, the phase slope being chosen to further reduce any residual frequency error.

FIG. 2 is a flow chart illustrating operations for implementing interference reduction in signal processor 24. Optionally, the step of removing systematic frequency error may be performed in Digital Signal Processor 30 instead of by hardware components divider 23d and subtractor 23f. At block 100, complex signal samples are input from the Analog-to-Digital convertors. Remaining systematic frequency error, if not reduced already by hardware components such as phase accumulator 23e and modulo-2π subtractor 23f, can be reduced digitally at block 101, and the signal amplitude may be scaled such that word length overflow does not occur during numerical processing. These adjustments are most easily performed by fixed point arithmetic additions and subtractions in the logpolar domain, where signal amplitude scaling is addition or subtraction of a scaling value to the logamplitude values, and frequency error compensation is modulo-2Pi addition or subtraction of a phase accumulator value from the phase values to remove systematic phase slope.

If the signal is in Cartesian form, scaling and frequency error correction may require complex multiplications, which digital signal processors can perform with a little additional complexity and/or cost in terms of power consumption. At block 102, scaled and systematic frequency error corrected values are converted from logpolar form to Cartesian form if not already in Cartesian form. Cartesian or I,Q form is preferred to implement the interference cancellation steps at blocks 103 and 104. At block 103, the mean of the I and Q values or alternatively the apparent origin for the I-values, Io, and Q-values, Qo, are estimated as discussed above. The estimated Io, Qo values are passed to block 104 together with the I and Q values from block 102, and at block 104 the best current estimate of Io is subtracted from each I value and the best current estimate of Qo is subtracted from each Q value. The output of block 104 includes I and Q values with reduced coherent, internal interference.

It is common in digital signal processing to input a batch of signal samples at a time for processing. In particular, in a Time Division Multiple Access radiotelephone communications system which transmits information to a particular receiver in an assigned timeslot, the receiver may capture and digitize the signal into a number of representative complex samples collected over the assigned timeslot, and pass the whole timeslot's worth of samples to Digital Signal Processor 30 for processing. Thus the mean of I (Io) and the mean of Q (Qo) can be computed using all the samples from the timeslot and then subtracted retrospectively from the collected samples before further processing. In this way, an earlier collected I,Q sample can be compensated for signal characteristics estimated from later collected samples, in an apparent reversal of the direction of time. For example, U.S. Pat. No. 5,335,250 entitled "Method And Apparatus For Bidirectional Demodulation Of Digitally Modulated Signals" to the inventor of the present invention discusses the processing of collected signal samples either forward or backward in time to obtain improved performance. This patent is hereby incorporated herein in its entirety by reference.

After interference reduction at block 104, there may be non-systematic signal frequency errors to be reduced, such as frequency errors between the transmitter and the receiver or Doppler shifts. The interference compensated I,Q values can be corrected by complex rotation at block 105 to reduce this signal frequency error. Signal values I',Q' compensated for both interference and frequency error are then passed from block 105 for decoding at block 106 to decode wanted information. The decoded information is then output at block 107.

The decoding may also reestimate the signal frequency error at block 108 and provide an improved estimate at block 109 for correction at block 105, as described for example in U.S. Pat. No. 5,136,616 entitled "Method Of Rapidly Controlling The Frequency Of A Coherent Radio Receiver And Apparatus For Carrying Out The Method" to the inventor of the present invention, and U.S. Pat. No. 5,093,848 entitled "Method Of Controlling The Frequency Of A Coherent Radio Receiver And Apparatus For Carrying Out The Method" to Raith. Both of these patents are hereby incorporated herein in their entirety by reference. Likewise, if the magnitudes of the I,Q values are not within an optimum range at block 110, the amount of scaling performed at block 101 may be reestimated during signal decoding at block 111 and an updated scaling value passed to block 101, thus implementing Automatic Gain Control (ACG).

As a modification to the operations of FIG. 2, blocks 103, 104, 105, and 106 can be combined into a single operation wherein the Io and Qo values and information symbols are estimated jointly. Estimates of Io and Qo can be improved if the modulation of I and Q by information symbols can be subtracted out. Furthermore, improved estimates of information symbols can be provided by improving the estimates of Io and Qo. The mutual dependence of improvements of estimates for Io and Qo on improvements of estimates for information symbols, and vice versa, can be resolved by iterative refinement, or by making use of the Viterbi algorithm.

The Viterbi algorithm tests various postulates for a sequence of information symbols and computes a "score" for each, based on how well the sequence explains the received complex signal samples. Associated with each postulated symbol sequence a separate estimate of Io and Qo is stored, each based on the assumption that the associated sequence is the correct sequence, and which is subtracted from received I and Q values before computing the "score". The Viterbi algorithm then extends the postulated sequences by all possible values of one new symbol and retains the best of each group of extended sequences that differ only in their oldest symbol position. When selection of a sequence to retain is made, the associated Io, Qo value is updated with the assumption that the newest symbol used to extend that sequence was the correct symbol, and the oldest symbol of the selected sequence is remembered in a history memory for each retained sequence. In this way, the values of Io and Qo are jointly estimated at the same time as the information symbol sequence is decoded.

Thus it has been described above how interference in a receiver which derives from the same reference frequency oscillator as used to derive all local oscillators and sampling clocks will, after suitable preliminary processing, appear as constant offsets to the real and imaginary Cartesian components of the complex signal vectors, which may be removed for example by techniques previously described in connection with zero-IF (homodyne) receivers. The incidence of blocked channels which occurs when a receiver is tuned to a channel frequency which coincides with an internal interference frequency may thus be substantially reduced. Many variations in the receiver block diagram can be made by persons skilled in the art without necessarily departing from the scope and spirit of the invention as described by the following claims.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A receiver tunable to a plurality of frequency channels, said receiver comprising:

a reference frequency generator which generates a reference frequency signal;

a downconverter which downconverts received signals to provide intermediate frequency signals wherein said down converter is synchronized to said reference frequency signal;

an analog-to-digital converter which generates a plurality of complex numbers representative of said received signals including interference components responsive to said intermediate frequency signals wherein said analog-to-digital converter is synchronized to said reference frequency signal; and a processor which estimates an origin point for said plurality of complex numbers and which subtracts said origin point from each of said complex numbers thereby producing interference-compensated complex numbers representative of said received signals with reduced internally generated interference and which processes said interference-compensated complex numbers to obtain desired signaling information.

2. A receiver according to claim 1 wherein said downconverter includes a local oscillator synchronized to said reference frequency signal, first and second mixers driven by said oscillator, and a combining network so that said received signals are provided to said first and second mixers, the outputs of which are combined in said combining network to provide said intermediate frequency signals.

3. A receiver according to claim 1 wherein said reference frequency generator comprises a reference frequency oscillator.

4. A receiver according to claim 1 wherein said received signals are received at an antenna, said receiver further comprising:
a filter serially coupled with said downconverter between said antenna and said analog-to-digital converter.

5. A receiver according to claim 1 wherein said received signals are received at an antenna, said receiver further comprising:
an amplifier serially coupled with said down converter between said antenna and said analog-to-digital converter.

6. A receiver according to claim 1 wherein said estimated origin point includes an 'x' coordinate Io and a 'y' coordinate Qo.

7. A receiver according to claim 1 further comprising:
a digital frequency synthesizer coupled with said reference frequency generator so that said receiver is tuned to channel frequencies that are related to said reference frequency by a ratio of two integers.

8. A receiver according to claim 1 wherein said analog-to-digital converter employs quadrature downconversion to analog I and Q signals followed by analog-to-digital conversion of each of said I and Q signals.

9. A receiver according to claim 1 wherein said analog-to-digital converter converts said intermediate frequency signals to pairs of values representative of instantaneous signal phase and instantaneous signal amplitude.

10. A receiver according to claim 1 wherein said analog-to-digital converter performs quadrature sampling of said intermediate frequency signal.

11. A receiver according to claim 1 wherein said plurality of complex numbers include compensation for systematic frequency error in the receiver.

12. A receiver according to claim 1 wherein said estimated origin point is estimated from a mean of real components of said plurality of complex numbers and from a mean of imaginary components of said plurality of complex numbers.

13. A receiver according to claim 1 wherein said estimated origin point is estimated by estimating a center of one of a circle and an arc on which said plurality of complex numbers are expected to lie.

14. A receiver according to claim 1 wherein said estimated origin point is estimated using a known signal pattern included in said received signals.

15. A receiver according to claim 1 wherein said estimated origin point is re-estimated using said desired signaling information.

16. A method for receiving signals over one of a plurality of frequency channels, said method comprising the steps of:
generating a reference frequency signal;
downconverting received signals to provide intermediate frequency signals wherein said downconvertering step is synchronized to said reference frequency signal;
generating a plurality of complex numbers representative of said received signals including interference components responsive to said intermediate frequency signals wherein said generation of said complex numbers is synchronized to said reference frequency signal;
estimating an origin point for said plurality of complex numbers;
subtracting said origin point from each of said complex numbers thereby producing interference-compensated complex numbers representative of said received signals with reduced internally generated interference; and
processing said interference-compensated complex numbers to obtain desired signaling information.

17. A method according to claim 16 wherein said down-converting step comprises synchronizing a local oscillator to said reference frequency signal, and driving first and second mixers with said synchronized local oscillator, mixing said received signals using said first and second mixers driven by said synchronized local oscillator, and combining outputs of said first and second mixers to provide said intermediate frequency signals.

18. A method according to claim 16 wherein said reference frequency signal is generated using a reference frequency oscillator.

19. A method according to claim 16 further comprising the step of:
filtering said received signals before generating said plurality of complex numbers.

20. A method according to claim 16 further comprising the step of:
amplifying said received signals before generating said plurality of complex numbers.

21. A method according to claim 16 wherein said estimated origin point includes an 'x' coordinate Io and a 'y' coordinate Qo.

22. A method according to claim 16 further comprising the step of:
tuning said receiver to channel frequencies that are related to said reference frequency by a ratio of two integers.

23. A method according to claim 16 wherein said step of generating said plurality of complex numbers comprises quadrature downconverting to analog I and Q signals followed by analog-to-digital converting each of said I and Q signals.

24. A method according to claim 16 wherein said step of generating said plurality of complex numbers comprises converting said intermediate frequency signals to pairs of values representative of instantaneous signal phase and instantaneous signal amplitude.

25. A method according to claim 16 wherein said step of generating said plurality of complex numbers comprises quadrature sampling of said intermediate frequency signals.

26. A method according to claim 16 wherein said plurality of complex numbers include compensation for systematic frequency error.

27. A method according to claim 16 wherein said estimated origin point is estimated from a mean of real components of said plurality of complex numbers and from a mean of imaginary components of said plurality of complex numbers.

28. A method according to claim 16 wherein said estimated origin point is estimated by estimating a center of one of a circle and an arc on which said plurality of complex numbers are expected to lie.

29. A method according to claim 16 wherein said estimated origin point is estimated using a known signal pattern included in said received signals.

30. A method according to claim 16 wherein said estimated origin point is re-estimated using said desired signaling information.

31. A receiver tunable to a plurality of frequency channels, said receiver comprising:
   a reference frequency generator which generates a reference frequency signal;
   a downconverter which downconverts received signals to provide intermediate frequency signals wherein said down converter is synchronized to said reference frequency signal;
   an analog-to-digital converter which generates a plurality of complex numbers representative of said received signals including interference components related to said reference frequency signal wherein said analog-to-digital converter is synchronized to said reference frequency signal and wherein said plurality of complex numbers are generated responsive to said intermediate frequency signals; and
   a processor which processes said complex numbers to compensate for said interference components and to obtain desired signaling information wherein said processor estimates an origin point for said plurality of complex numbers and subtracts said origin point from each of said complex numbers and wherein said estimated origin point is estimated by estimating a center of one of a circle and an arc on which said plurality of complex numbers are expected to lie.

32. A receiver according to claim 31 wherein said processor estimates an origin displacement for each of said complex numbers while demodulating and decoding information symbols based on said complex numbers corrected for said origin displacement.

33. A receiver according to claim 32 wherein each of said estimates of each of said origin displacements for each of said complex numbers includes an 'x' coordinate Io and a 'y' coordinate Qo.

34. A receiver according to claim 31 wherein said downconverter includes a local oscillator synchronized to said reference frequency signal, first and second mixers driven by said oscillator, and a combining network so that said received signals are provided to said first and second mixers, the outputs of which are combined in said combining network to provide said intermediate frequency signals.

35. A receiver according to claim 31 wherein said reference frequency generator comprises a reference frequency oscillator.

36. A method for receiving signals over one of a plurality of frequency channels, said method comprising the steps of:
   generating a reference frequency signal;
   downconverting received signals to provide intermediate frequency signals wherein said downconvertering step is synchronized to said reference frequency signal;
   generating a plurality of complex numbers representative of said received signals including interference components related to said reference frequency signal wherein said generation of said complex numbers is synchronized to said reference frequency signal and wherein said plurality of complex signals are generated responsive to said intermediate frequency signals; and
   processing said complex numbers to compensate for said interference components and to obtain desired signaling information wherein said processing said complex numbers comprises estimating an origin point for said plurality of complex numbers and subtracting said origin point from each of said complex numbers and wherein said estimated origin point is estimated by estimating a center of one of a circle and an arc on which said plurality of complex numbers are expected to lie.

37. A method according to claim 36 wherein said processing step comprises estimating an origin displacement for each of said complex numbers while demodulating and decoding information symbols based on said complex numbers corrected for said origin displacement.

38. A method according to claim 37 wherein each of said estimates of each of said origin displacements for each of said complex numbers includes an 'x' coordinate Io and a 'y' coordinate Qo.

39. A method according to claim 36 wherein said downconverting step comprises synchronizing a local oscillator to said reference frequency signal, driving first and second mixers with said synchronized local oscillator, mixing said received signals using said first and second mixers driven by said synchronized local oscillator, and combining outputs of said first and second mixers to provide said intermediate frequency signals.

40. A method according to claim 36 wherein said reference frequency signal is generated using a reference frequency oscillator.

41. A receiver tunable to a plurality of frequency channels, said receiver comprising:
   a reference frequency generator which generates a reference frequency signal;
   a downconverter which downconverts received signals to provide intermediate frequency signals wherein said down converter is synchronized to said reference frequency signal;
   an analog-to-digital converter which generates a plurality of complex numbers representative of said received signals including interference components related to said reference frequency signal wherein said analog-to-digital converter is synchronized to said reference frequency signal and wherein said plurality of complex numbers are generated responsive to said intermediate frequency signals; and
   a processor which digitally high-pass filters said complex numbers to compensate for said reference frequency related interference and to obtain desired signaling information wherein said processor estimates an origin point for said plurality of complex numbers and subtracts said origin point from each of said complex numbers and wherein said estimated origin point is estimated by estimating a center of one of a circle and an arc on which said plurality of complex numbers are expected to lie.

42. A receiver according to claim 41 wherein said processor estimates an origin displacement for each of said complex numbers while demodulating and decoding information symbols based on said complex numbers corrected for said origin displacement.

43. A receiver according to claim 42 wherein each of said estimates of each of said origin displacements for each of said complex numbers includes an 'x' coordinate Io and a 'y' coordinate Qo.

44. A receiver according to claim 41 wherein said downconverter includes a local oscillator synchronized to said reference frequency signal, first and second mixers driven by said oscillator, and a combining network so that said received signals are provided to said first and second mixers, the outputs of which are combined in said combining network to provide said intermediate frequency signals.

45. A receiver according to claim 41 wherein said reference frequency generator comprises a reference frequency oscillator.

46. A method for receiving signals over one of a plurality of frequency channels, said method comprising the steps of:

generating a reference frequency signal;

downconverting received signals to provide intermediate frequency signals wherein said downconvertering step is synchronized to said reference frequency signal;

generating a plurality of complex numbers representative of said received signals including interference components related to said reference frequency signal wherein said generating of said complex numbers is synchronized to said reference frequency signal and wherein plurality of complex numbers are generated responsive to said intermediate frequency signals;

digitally high-pass filtering said complex numbers to compensate for said reference frequency related interference and to obtain desired signaling information;

estimating an origin point for said plurality of complex numbers wherein said estimated origin point is estimated by estimating a center of one of a circle and an arc on which said plurality of complex numbers are expected to lie; and subtracting said origin point from each of said complex numbers.

47. A method according to claim 46 wherein said processing step comprises estimating an origin displacement for each of said complex numbers while demodulating and decoding information symbols based on said complex numbers corrected for said origin displacement.

48. A method according to claim 47 wherein each of said estimates of each of said origin displacements for each of said complex numbers includes an 'x' coordinate Io and a 'y' coordinate Qo.

49. A method according to claim 46 wherein said downconverting step comprises synchronizing a local oscillator to said reference frequency signal, driving first and second mixers with said synchronized local oscillator, mixing said received signals using said first and second mixers driven by said synchronized local oscillator, and combining outputs of said first and second mixers to provide said intermediate frequency signals.

50. A method according to claim 46 wherein said reference frequency signal is generated using a reference frequency oscillator.

* * * * *